US008526746B1

United States Patent
Sankar et al.

(10) Patent No.: US 8,526,746 B1
(45) Date of Patent: Sep. 3, 2013

(54) NEAR LOSSLESS DATA COMPRESSION METHOD USING NONUNIFORM SAMPLING

(75) Inventors: Pathamadai V. Sankar, Tustin, CA (US); Leonard Anthony Ferrari, Capitola, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 70 days.

(21) Appl. No.: 13/404,325

(22) Filed: Feb. 24, 2012

Related U.S. Application Data

(60) Provisional application No. 61/446,770, filed on Feb. 25, 2011.

(51) Int. Cl.
G06T 9/00 (2006.01)
(52) U.S. Cl.
CPC .................................. *G06T 9/005* (2013.01)
USPC ............................ 382/232; 382/245; 382/239
(58) Field of Classification Search
None
See application file for complete search history.

(56) References Cited

U.S. PATENT DOCUMENTS

| 7,496,619 B2 * | 2/2009 | Aldroubi et al. ............... 708/446 |
| 2011/0176743 A1 * | 7/2011 | Sankar et al. .................. 382/248 |

OTHER PUBLICATIONS

Ramponi et al. "An adaptive irregular sampling algorithm and its application to image coding," 2001, Image and Vision Computing (19): pp. 451-460.*
Linderhed, A. "Compression by Image Empirical Mode Decomposition," 2005, IEEE.*
Averbuch et al. "Adaptive compressed image sensing using dictionaries," 2012, Siam J. Imaging Science (5): pp. 57-89.*
Candes et al. "An introduction to compressive sampling," Mar. 2008, IEEE Signal Processing Magazine, pp. 21-30.*

* cited by examiner

*Primary Examiner* — Vu Le
*Assistant Examiner* — Samah Beg
(74) *Attorney, Agent, or Firm* — Lisa A. Norris

(57) ABSTRACT

Embodiments in accordance with the invention provide methods of near lossless data compression based on nonuniform sampling. Alternate embodiments in accordance with the invention improve the compression factor of lossy compression methods by using nonuniform sampling.

12 Claims, 14 Drawing Sheets

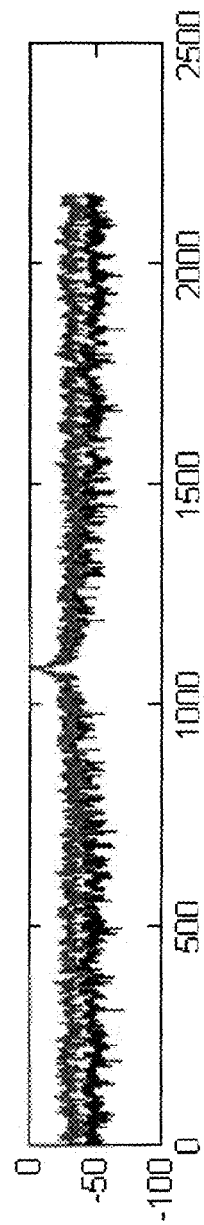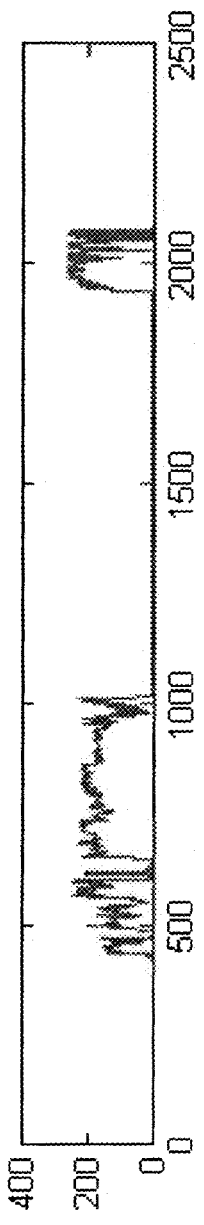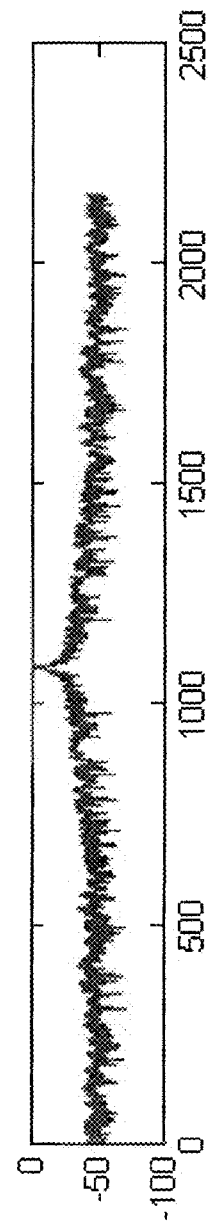

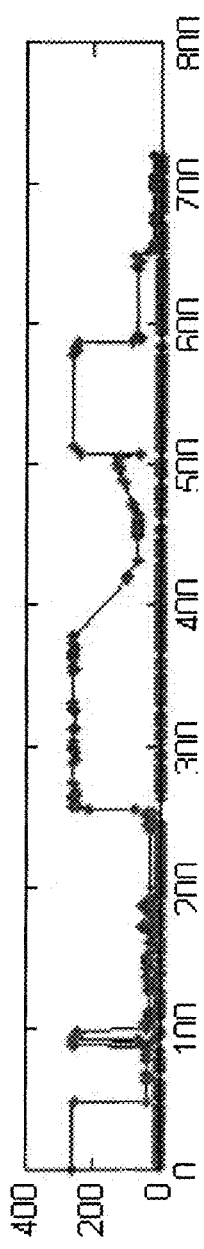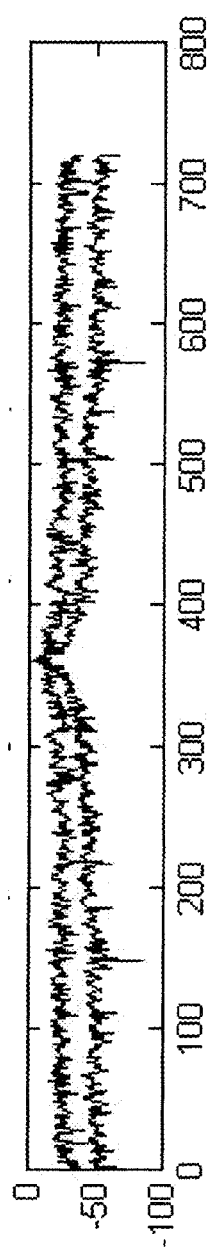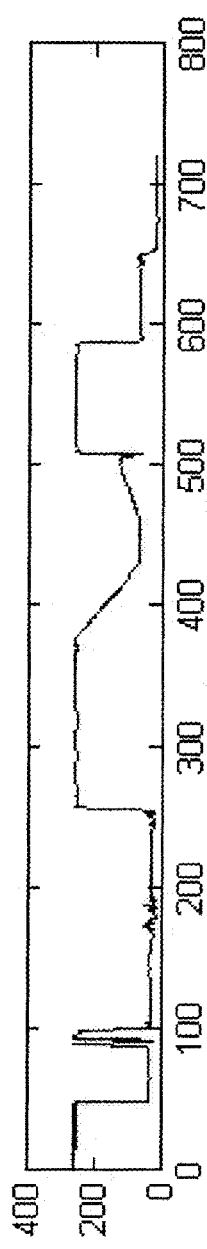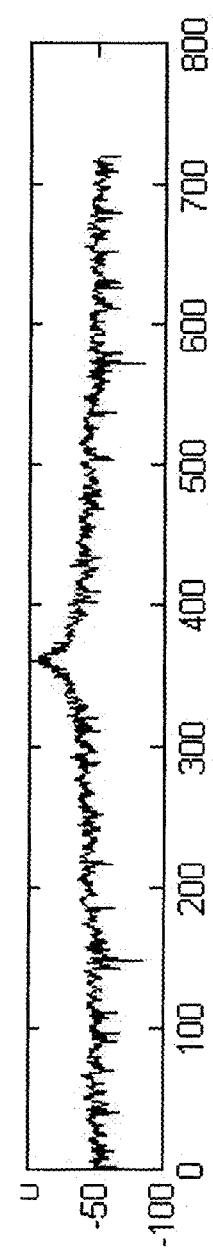

NEAR LOSSLESS DATA COMPRESSION METHOD USING NONUNIFORM SAMPLING

CROSS-REFERENCE TO RELATED APPLICATIONS

This application claims the benefit of U.S. Provisional Application No. 61/446,770, filed Feb. 25, 2011, which is hereby incorporated in its entirety by reference.

BACKGROUND OF THE INVENTION

1. Field of the Invention

The present invention relates generally to data compression.

2. Description of the Related Art

The prior art Shannon sampling theorem dictates that any signal needs to be sampled at the Nyquist rate which is the twice the maximum cut off frequency at which the bandwidth of the signal tends towards zero. The Shannon sampling theorem is theoretically valid only for a stationary signal whose second order statistics do not vary with time. In real life, however, most signals are non-stationary, and the spectral content, the center frequency, and the bandwidth of the local signal vary with time. Researchers have attempted several prior art smart sampling approaches to sub sample the signal below the Nyquist rate exploiting the property of time varying spectral characteristics of the signal. Although these attempts have resulted in some improvement in reduced sampling for a class of signals, they did not arrive at lossless compression schemes or even near lossless compression with significant reduction in sampling rates.

In parallel to and complementing the effort of prior art sampling techniques, prior art data compression methods have been developed for lossless compression schemes to reduce the bit rate per sample by using Arithmetic Coding, Run Length Coding, Huffman Compression or Lev-Zimpel-Welch (LZW) and Discrete Cosine Transform (DCT) or Discrete Wavelet Transform (DWT) approaches. The DCT or DWT had also been successfully used for lossy compression with significant bit rates per sample in the JPEG and JPEG 2000 and MPEG standards respectively.

SUMMARY OF THE INVENTION

Embodiments in accordance with the invention nonuniformly sample signals below the Nyquist rate without many of the associated aliasing artifacts seen in prior art methods as the signal can be uniquely reconstructed with negligible, i.e., below noise level, errors using a linear (cubic) interpolation. Embodiments in accordance with the invention can be used in conjunction with state of the art lossless or lossy compression software or hardware to further improve the compression factor or reduce the use of storage or bandwidth.

Embodiments in accordance with the invention are best understood by reference to the following detailed description when read in conjunction with the accompanying drawings.

BRIEF DESCRIPTION OF THE DRAWINGS

FIG. 2A illustrates Shannon sampling method samples of a signal with an overlay of nonuniform samples of the signal.

FIG. 2B illustrates the power spectrum of a Shannon sampled signal with an overlay of the power spectrum of a nonuniform sampled signal.

FIG. 2C illustrates a linear interpolated signal from Shannon sampling method samples with an overlay of a linear interpolated signal from nonuniform samples of the signal.

FIG. 2D illustrates a power spectrum of a linear interpolated signal from Shannon samples with an overlay of the power spectrum of a linear interpolated signal from nonuniform samples.

FIG. 4A illustrates Shannon sampling method samples of a signal with an overlay of nonuniform samples of the signal.

FIG. 4B illustrates the power spectrum of a Shannon sampled signal with an overlay of the power spectrum of a nonuniform sampled signal.

FIG. 4C illustrates a linear interpolated signal from Shannon sampling method samples with an overlay of a linear interpolated signal from nonuniform samples of the signal.

FIG. 4D illustrates a power spectrum of a linear interpolated signal from Shannon samples with an overlay of the power spectrum of a linear interpolated signal from nonuniform samples.

Embodiments in accordance with the invention are further described herein with reference to the drawings.

DETAILED DESCRIPTION OF THE INVENTION

Embodiments in accordance with the invention provide a method of data compression based on nonuniform sampling, herein also termed a near lossless nonuniform sampling compression method. Alternate embodiments in accordance with the invention improve the compression factor of lossy compression methods by using nonuniform sampling to provide lossy nonuniform sampling compression methods.

Figure 1:
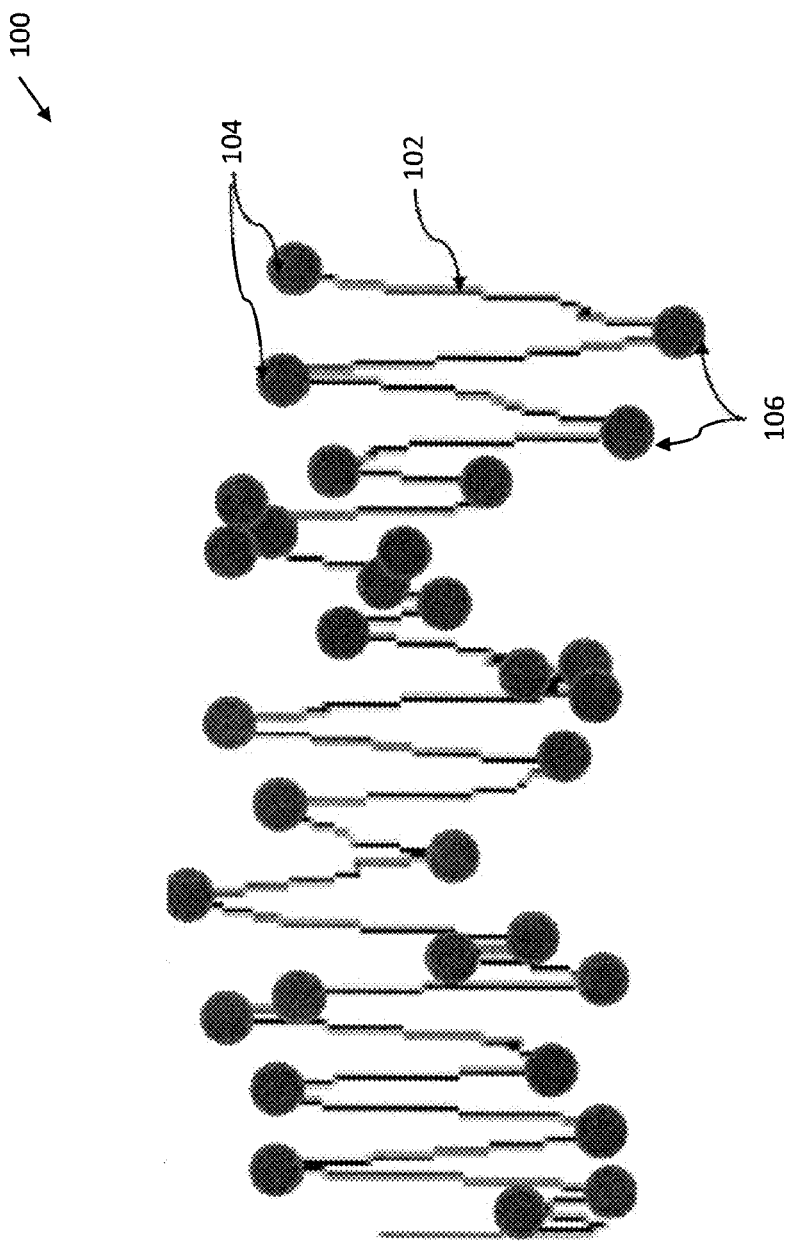
FIG. 1 illustrates a signal on which the local maxima and minima locations of samples are overlaid on the signal.

FIG. 1 illustrates a diagram 100 of a signal 102 on which local maxima locations and local minima locations of nonuniform samples are overlaid on signal 102. Input number of samples N and number of maxima and minima locations K provides a compression ratio of N/K. Assuming the locations of the nonuniform samples are at x(i), then there are f(i) samples at x(i) where i=0 . . . K−1.

As is well known to those of skill in the art, maxima and minima locations represent the apex and trough locations, respectively, of a sample signal. For example, locations 104 represent two of the plurality of maxima locations on signal 102, and locations 106 represent two of the plurality of minima locations on signal 102. The remainder of the plurality of maxima and minima locations although identified by the dots are not further individually labeled in FIG. 1 for clarity of description.

It can be appreciated that FIG. 1 illustrates that signal 102 is uniquely represented by the plurality of maxima and minima locations and their associated sample values. Nonuniform sampling of a signal may result in a reduced number of samples much lower than permitted by the Nyquist criterion but that still uniquely represent the signal as detailed below with reference to FIGS. 2 through 5.

FIGS. 2 through 5 represent example signals in which nonuniform sampling is illustrated in comparison with the traditional Shannon sampling method. FIGS. 2A-2D illustrate a comparison of nonuniform sampling of a row from a high resolution space shuttle launch image having original signal length 2160, compression ratio 4.5 and an absolute mean error 0.4% for linear interpolation, with the original signal. The first plot, FIG. 2A, illustrates the Shannon sampling method samples with an overlay of nonuniform samples of the signal.

The second plot, FIG. 2B, illustrates the Shannon samples power spectrum of the signal with an overlay of the power spectrum of the nonuniform samples with zeros interspersed at locations which are neither maxima nor minima. In FIG. 2B, the top spectrum is the nonuniform sample power spectrum and the bottom spectrum is the original signal power spectrum.

The third plot, FIG. 2C, illustrates the Shannon sampling method samples with an overlay of the linear interpolated signal from the nonuniform samples. The fourth plot, FIG. 2D illustrates the Shannon samples power spectrum of the signal with an overlay of the power spectrum of the linear interpolated signal from the nonuniform samples.

FIGS. 3A-3D illustrate uniform subsampling of a row from the high resolution space shuttle launch image having original signal length 2160, compression ratio 5, absolute mean error 19.8% for linear interpolation.

Figure 3A:
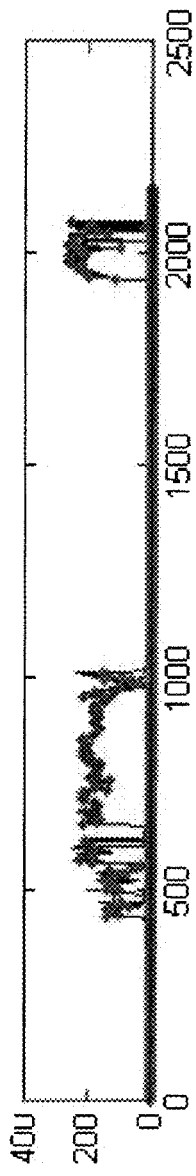
FIG. 3A illustrates a signal with an overlay of uniform samples of the signal.
Figure 3B:
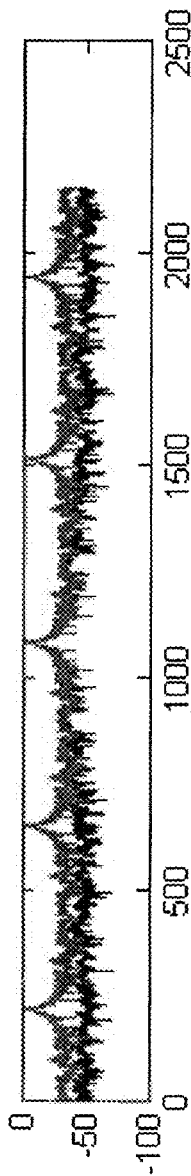
FIG. 3B illustrates a power spectrum of the signal with an overlay of a power spectrum of uniform samples of the signal.

The first plot, FIG. 3A, illustrates the signal with an overlay of uniform samples of the signal. The second plot, FIG. 3B illustrates the power spectrum of the signal with an overlay of the power spectrum of the uniform samples. In FIG. 3B, the top spectrum is the uniform sample power spectrum and the bottom spectrum is the original signal power spectrum.

Figure 3C:
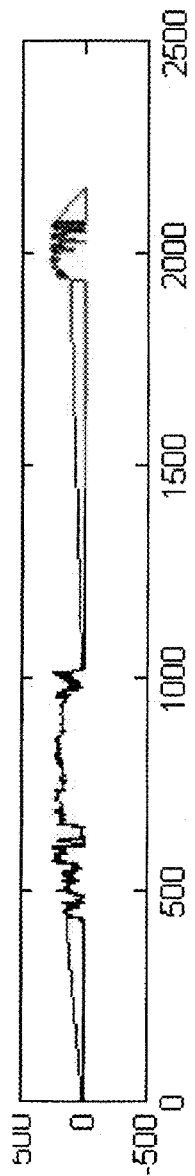
FIG. 3C illustrates a linear interpolated signal with an overlay of the linear interpolated signal from uniform samples of the signal.

The third plot, FIG. 3C illustrates the linear interpolated signal with an overlay of the linear interpolated signal from the uniform samples. In FIG. 3C, the top signal is the signal from the interpolated uniform samples and the bottom signal is the interpolated original signal.

Figure 3D:
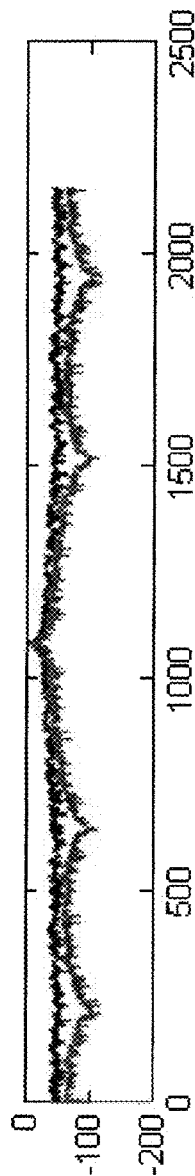
FIG. 3D illustrates a power spectrum of a linear interpolated signal with an overlay of a power spectrum of a linear interpolated signal from uniform samples of the signal.
Figure 5A:
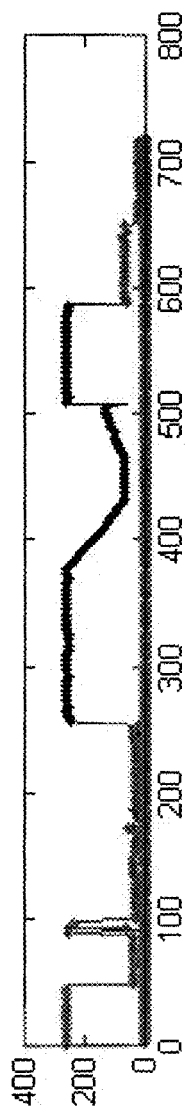
FIG. 5A illustrates a signal with an overlay of uniform samples of the signal.
Figure 5B:
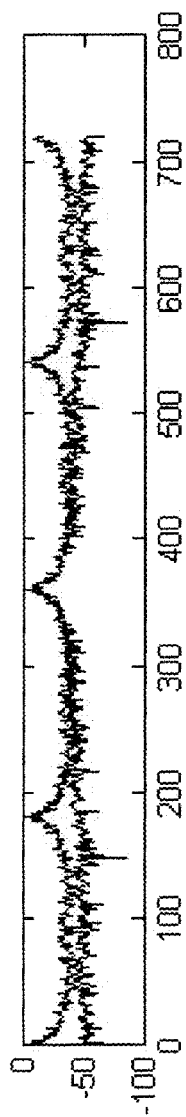
FIG. 5B illustrates a power spectrum of the signal with an overlay of a power spectrum of uniform samples of the signal.
Figure 5C:
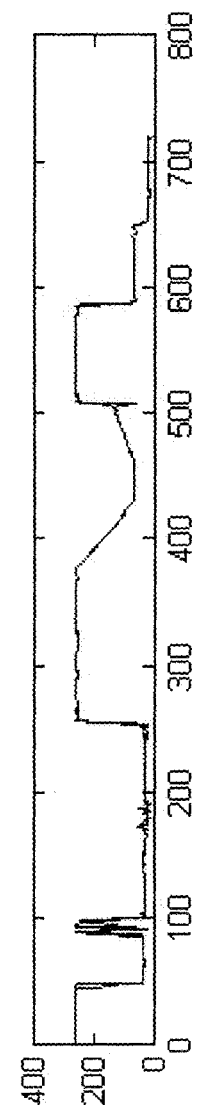
FIG. 5C illustrates a linear interpolated signal with an overlay of the linear interpolated signal from uniform samples of the signal.
Figure 5D:
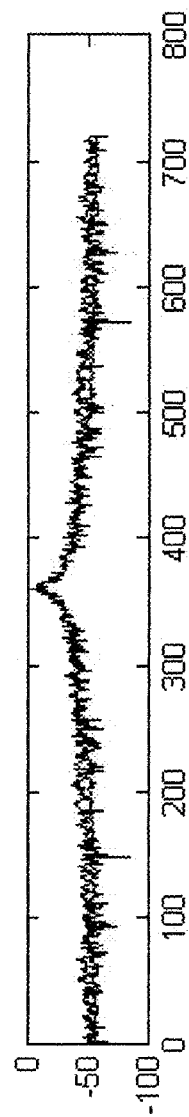
FIG. 5D illustrates a power spectrum of a linear interpolated signal with an overlay of a power spectrum of a linear interpolated signal from uniform samples of the signal.

The fourth plot, FIG. 3D illustrates the power spectrum of the linear interpolated signal with an overlay of the power spectrum of the linear interpolated signal from the uniform samples. In FIG. 3D, the top spectrum is the interpolated original signal power spectrum and the bottom spectrum is the power spectrum of the linear interpolated signal from the uniform samples.

In FIGS. 2A-2D the nonuniform sampling does not cause the traditional folding of the spectrum associated with sub sampling and aliasing, however this aliasing and folding of the spectrum phenomenon is present in FIGS. 3A-3D with uniform subsampling.

With linear interpolation the nonuniform sampling results in an absolute mean percentage error of 0.4%, while the traditional uniform subsampling technique results in an error of 19.8%. This demonstrates the improved error results obtained from nonuniform sampling. With cubic interpolation these errors can be further reduced demonstrating the use of nonuniform sampling as a more preferable near lossless sampler.

In FIGS. 4 and 5 use of nonuniform sampling on a row from a CAD model image for a compression factor of 3.9 results in an absolute mean error of 0.2% for nonuniform sampling and for a compression factor of 4 an absolute mean error of 1.3% for linear interpolation. In FIG. 4B, the top spectrum is the nonuniform sample power spectrum and the bottom spectrum is the original signal power spectrum. In FIG. 5B, the top spectrum is the uniform sample power spectrum and the bottom spectrum is the original signal power spectrum. In FIG. 5D, the top spectrum is the interpolated original signal power spectrum and the bottom spectrum is the power spectrum of the linear interpolated signal from the uniform samples. These test results demonstrate that nonuniform sampling provides a near lossless compression method which can result on the average less than 0.5% absolute mean error with linear interpolation and even far less with cubic interpolation.

Figure 6A:
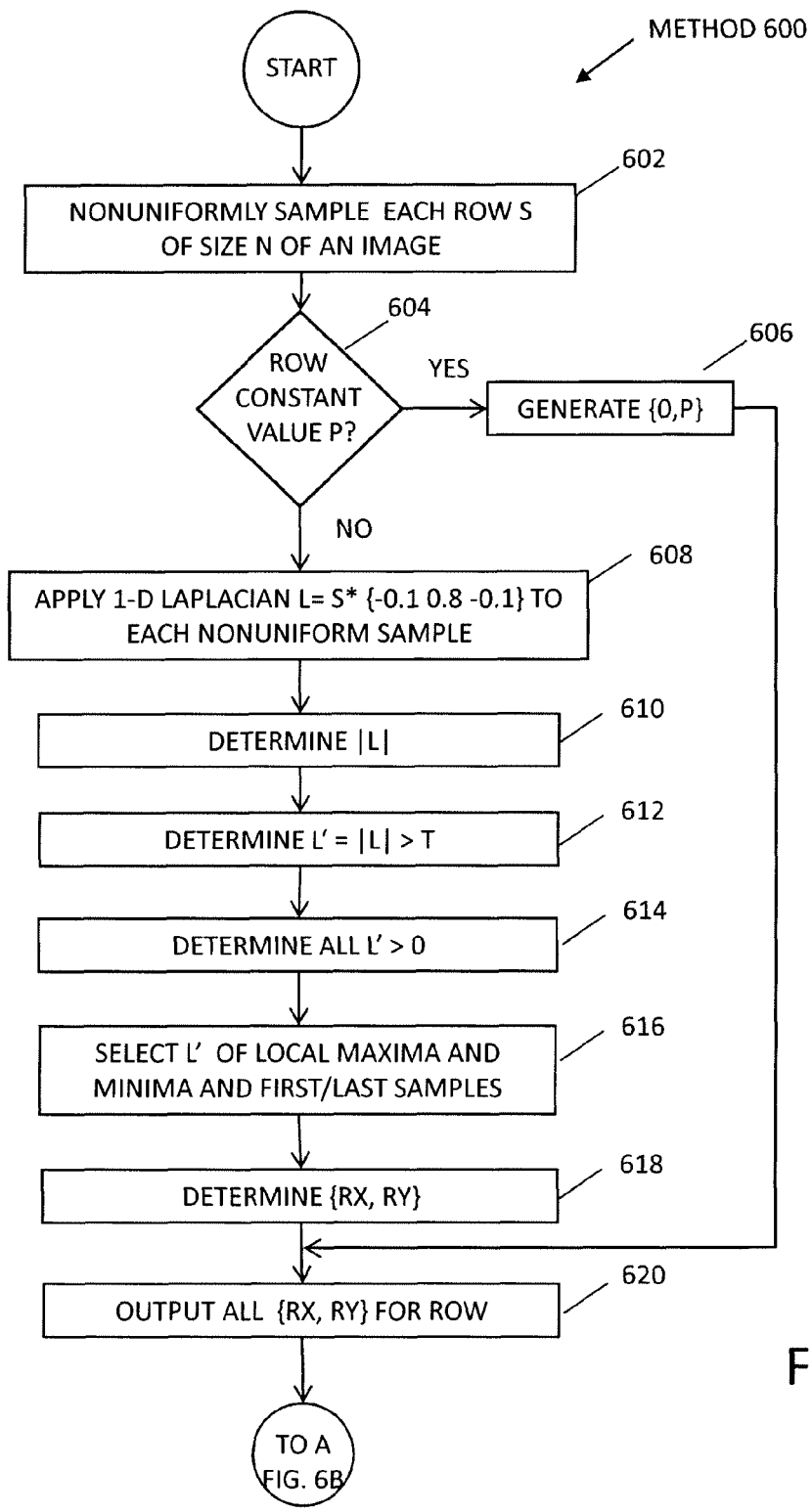
FIGS. 6A and 6B illustrate a process flow diagram of a near lossless nonuniform sampling compression method in accordance with one embodiment.
Figure 6B:
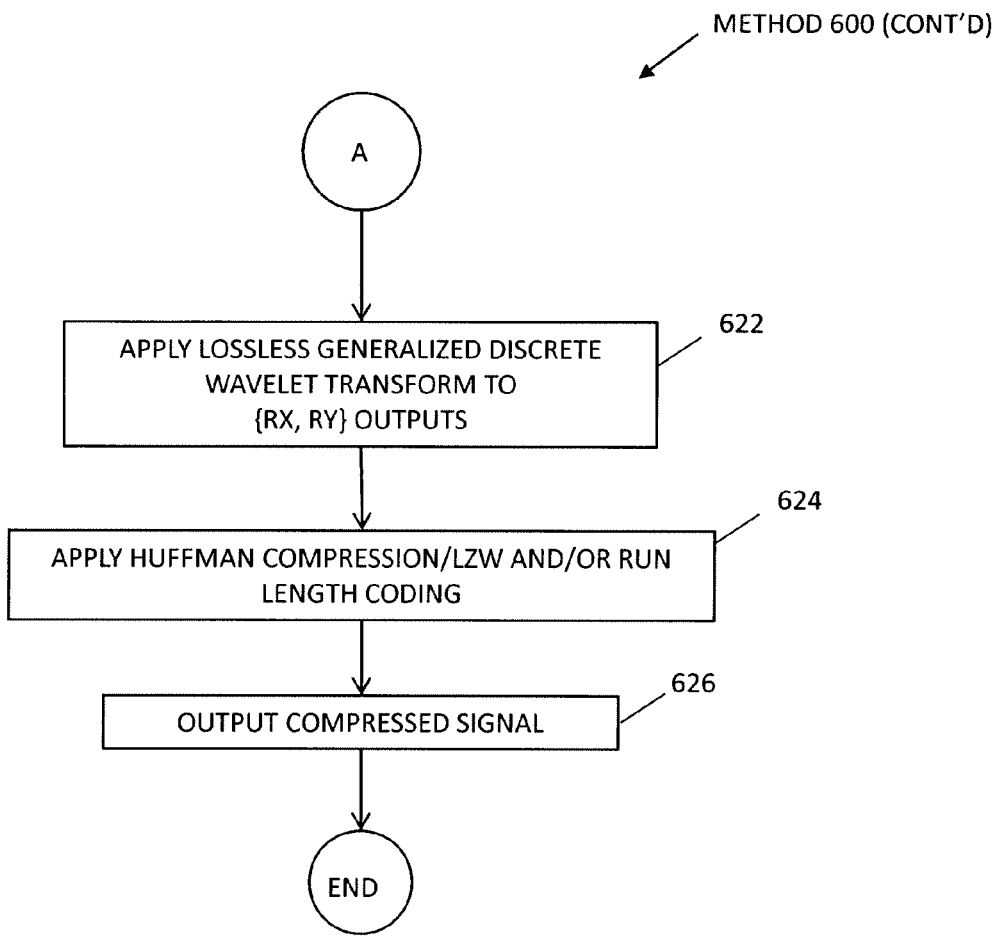

FIGS. 6A and 6B together illustrate a process flow diagram of a near lossless nonuniform sampling compression method 600 in accordance with one embodiment. Table 1 illustrates an example of the calculation of RX, RY for a sample row of a sample image, with N=7, where N is the number of nonuniform samples.

Referring now to FIG. 6A and Table 1, in accordance with one embodiment a near lossless nonuniform sampling compression method 600 is described. Referring to FIG. 6A, in operation 602, each row S of size N of an image is nonuniformly sampled. In Table 1, the example row, has N=7 nonuniform samples, with values of 5, 8, 12, 7, 2, 1, and 10.

In operation 604, if a row has a constant value P (YES), processing continues to operation 606 and an {RX, RY} value of {0, P} is generated. Otherwise, if the row does not have a constant value P (NO), processing continues to operation 608.

In operation 608, a 1-D Laplacian transform of L=S*{−0.1 0.8 −0.1} is applied to each nonuniform sample in the row to obtain an L value. The 1-D Laplacian transform is well known to those of skill in the art and not further detailed herein. Referring again to Table 1, application of the 1-D Laplacian transform to the nonuniform samples results in L values of 3.2, 4.7, 8.1, 4.2, 0.8, −0.4, and 7.9.

In operation 610, the absolute value |L| of each L value is determined. Referring to Table, 1 the absolute values are 3.2, 4.7, 8.1, 4.2, 0.8, 0.4, and 7.9.

In operation 612, the value L' (L prime) is assigned to absolute values greater than a threshold value T, L'=|L|>T, where T is a threshold value. In one embodiment, the threshold T is defined as T=(0.1*max(abs(S))/100) where S is the input signal (or row of the image). In Table 1, for example, the threshold value T is set at 0.01 where the max(S) is 0.1. As all the absolute values for all the samples are greater than the threshold value T, the values of L' are 3.2, 4.7, 8.1, 4.2, 0.8, 0.4, and 7.9.

In operation 614, all non-zero values of L' are determined (L'>0) and represent maxima and minima locations in the row. Thus, in Table 1, all the values of L' are greater than zero having values of 3.2, 4.7, 8.1, 4.2, 0.8, 0.4, and 7.9.

In operation 616, the L' value of the first sample of the row, the L' value of the last sample of the row, and all the local maxima and minima L' values for the row are selected from the values of L'>0. Thus, as shown in Table 1 the selected L' values are respectively, 3.2, 7.9, 8.1, and 0.4.

In operation 618, an {RX, RY} value is generated for each sample selected in operation 616, where RY is the non-zero value of the sample; and RX is the bit representation of |L|>0. Thus, as shown in Table 1, RX values are 1, 3, 6, and 7 and RY values are 5, 12, 1, and 10, which results in the {RX, RY} values of {1,5}, {3,12}, {6,1}, and {7,10}.

TABLE 1

| Bit representation | 1 | 2 | 3 | 4 | 5 | 6 | 7 |
|---|---|---|---|---|---|---|---|
| S | 5 | 8 | 12 | 7 | 2 | 1 | 10 |
| L = S * {−.1 .8 .1} | 3.2 | 4.7 | 8.1 | 4.2 | 0.8 | −0.4 | 7.9 |
| |L| | 3.2 | 4.7 | 8.1 | 4.2 | 0.8 | 0.4 | 7.9 |
| L' = |L| > T, where T = 0.01(max(S)) = 0.1 | 3.2 | 4.7 | 8.1 | 4.2 | 0.8 | 0.4 | 7.9 |
| Max, Min (L' > 0) | 3.2 | 4.7 | 8.1 | 4.2 | 0.8 | 0.4 | 7.9 |
| By default first and last samples | 3.2 | 4.7 | 8.1 | 4.2 | 0.8 | 0.4 | 7.9 |
| RX | 1 | | 3 | | | 6 | 7 |
| RY | 5 | | 12 | | | 1 | 10 |
| Compressed output RX | 1 | 3 | 6 | 7 | | | |
| Compressed output RY | 5 | 12 | 1 | 10 | | | |

In operation 620, the {RX, RY} values are output for the row. Thus for the example, the compressed output values are {1,5}, {3,12}, {6,1}, and {7,10}.

In operation 622, a lossless Generalized Discrete Wavelet Transform (GDWT), such as a 1-2-1 GDWT, is applied to each output {RX, RX} value to generate an output wavelet transform of the scanned row. The 1-2-1 Generalized Discrete Wavelet Transform is further described in US2011/0176743A1, published Jul. 21, 2011, and hereby incorporated in its entirety by reference. In alternate embodiments, a Haar GDWT, 1-4-GDWT, Daubechies GDWT, or other versions of GDWT can also be utilized with varying compression results.

In operation 624, the Huffman Compression, the Lev-Zimpel-Welch (LZW) and/or a run length coding algorithm is applied to the output wavelet transform from operation 622 to generate an output near lossless nonuniform sampling compressed signal representing the row of the image. Huffman compression, LZW coding and run length coding are all well known to those of skill in the art and not further detailed herein.

In operation 626, the near lossless nonuniform sampling compressed signal representing the row of the image is output.

Figure 7:
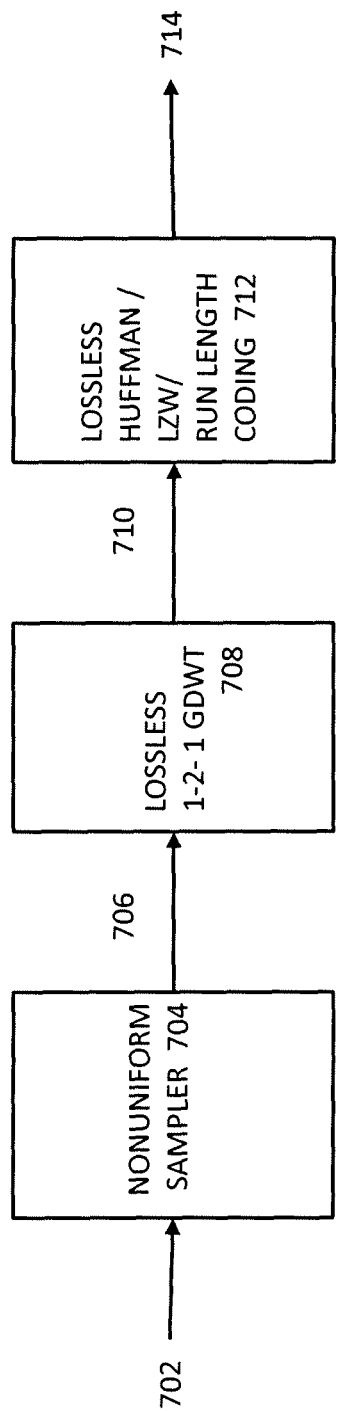
FIG. 7 illustrates a block diagram of a device using the near lossless nonuniform sampling compression method of FIG. 6 in accordance with one embodiment.

FIG. 7 illustrates a block diagram of a device 700 using the near lossless nonuniform sampling compression method 600 of FIGS. 6A and 6B in accordance with one embodiment. In device 700 a image 702, such as an image signal for a row of an image, is input to a nonuniform sampler 704 which determines and outputs the compressed {RX, RY} values 706 for each row of the signal as detailed above with reference to operations 602-620 (FIG. 6A). The compressed output {RX, RY} values 706 for each row of the signal are then input to the lossless 1-2-1 generalized discrete wavelet transform module 708 to generate an output wavelet transform 710 as described with reference to operation 622 (FIG. 6B). The output wavelet transform 710 is then input to a compression module 712 which utilizes Huffman compression, LZW, and/or a run length coding algorithm as described with reference to operation 624 (FIG. 6B) to determine and output a near lossless nonuniform sampling compressed signal 714 representing the row of image signal 702.

Figure 8A:
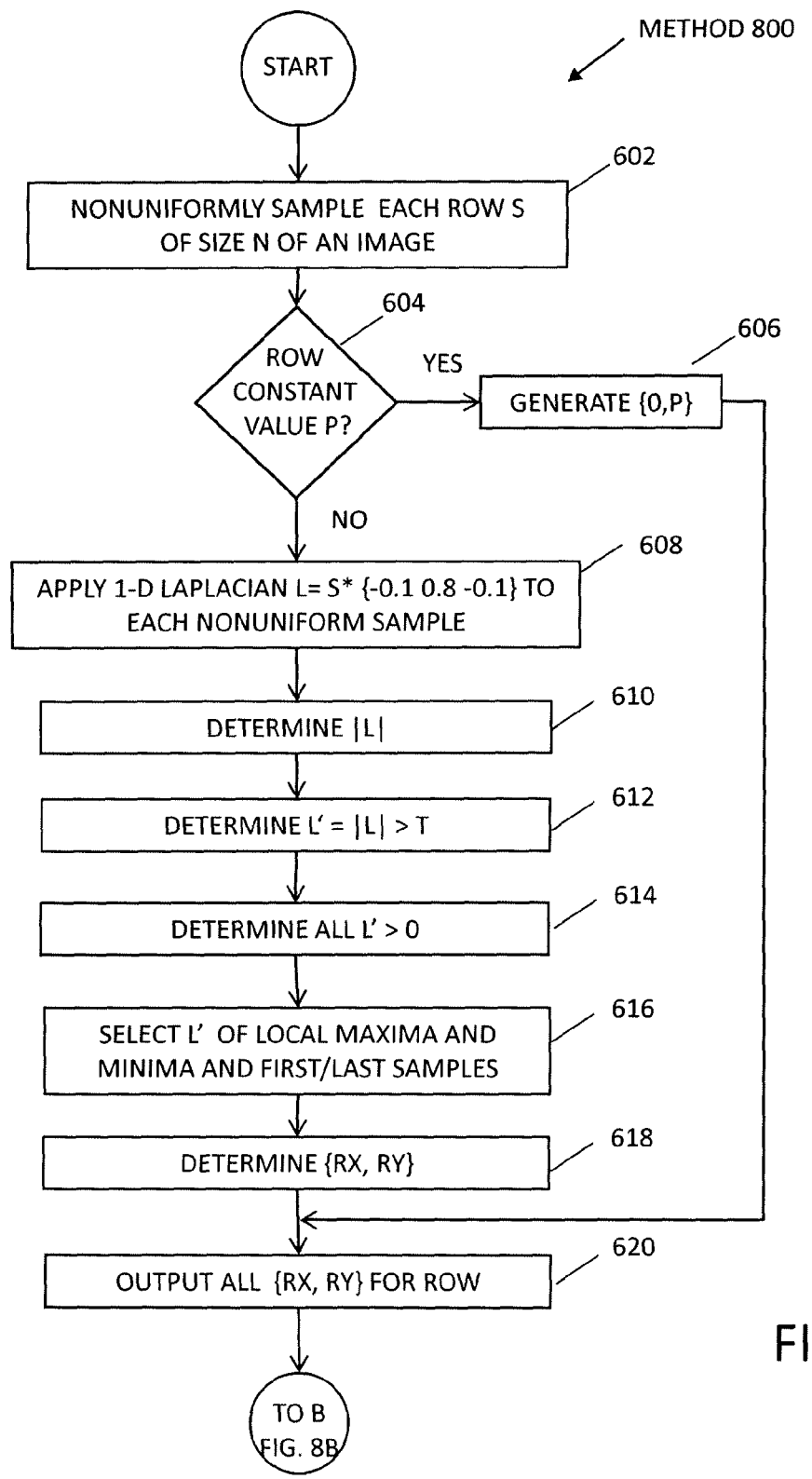
FIGS. 8A and 8B illustrate a process flow diagram of a lossy nonuniform sampling compression method in accordance with another embodiment.
Figure 8B:
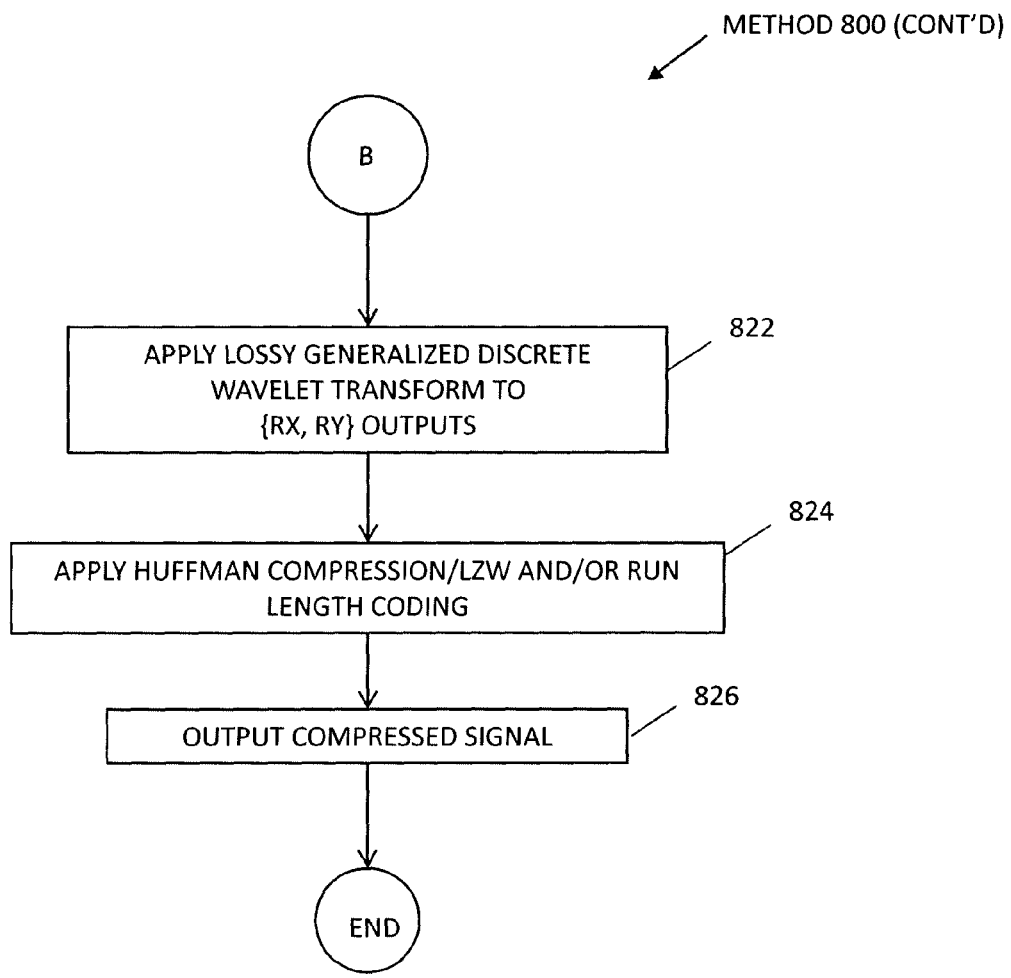

FIGS. 8A and 8B illustrate a process flow diagram of a lossy nonuniform sampling compression method 800 in accordance with another embodiment. Referring to FIG. 8A, operations 602-620 are performed on each row S of size N of an image as earlier described with reference to FIGS. 6A and 6B and method 600. Each {RX, RY} value output from operation 620 is input to operation 822(FIG. 8B).

Referring now to FIG. 8B, in operation 822, a lossy Generalized Discrete Wavelet Transform, such as a 1-2-1 GDWT, is applied to each output {RX, RX} value to generate a wavelet transform of the row. The lossy 1-2-1 Generalized Discrete Wavelet Transform is further described in US2011/0176743A1, published Jul. 21, 2011, and hereby incorporated in its entirety by reference. In other embodiments, other lossy wavelet transforms can also be used with varying compression results.

In operation 824, the Huffman Compression, the LZW and/or a run length coding algorithm is applied to the output wavelet transform from operation 822 to generate a lossy nonuniform sampling compressed signal representing the row of the image.

In operation 826, the lossy nonuniform sampling compressed signal representing the row of the image is output.

Figure 9:
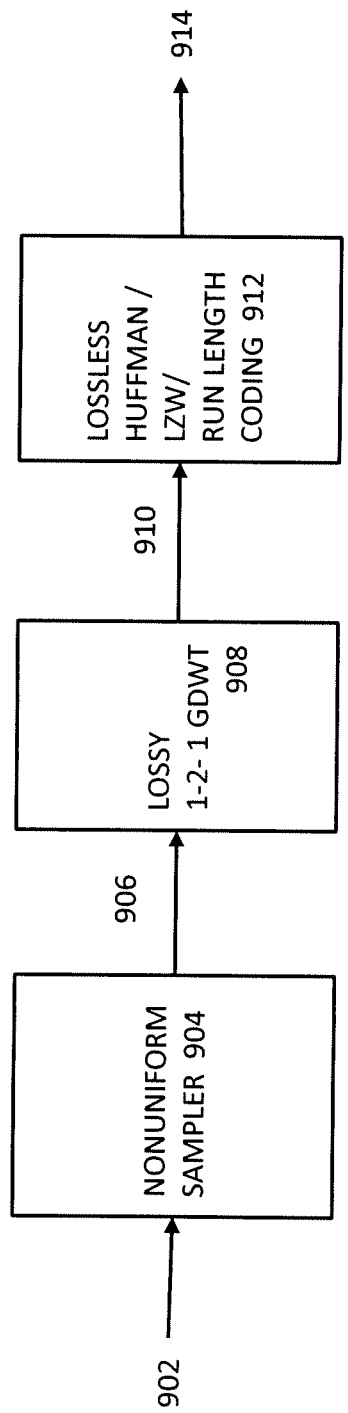
FIG. 9 illustrates a block diagram of a device using the lossy nonuniform sampling compression method of FIG. 8 in accordance with another embodiment.

FIG. 9 illustrates a block diagram of a device 900 using the lossy nonuniform sampling compression method 800 of FIGS. 8A and 8B in accordance with another embodiment. In device 900 an image signal 902 is input to a nonuniform sampler 904 which determines and outputs the {RX, RY} values 906 for each row of the image as detailed above with reference to FIG. 8A and operations 602-620. The output {RX, RY} values 906 for each row of the signal are then input to the lossy 1-2-1 generalized discrete wavelet transform module 908 to generate an output wavelet transform 910 as described with reference to operation 822(FIG. 8B). The output wavelet transform 910 is then input to a compression module 912 which utilizes Huffman compression, LZW, and/or a run length coding algorithm as described with reference to operation 824 (FIG. 8B) to determine and output a lossy nonuniform sampling compressed signal 914 representing the row of image 902.

In trials, the near lossless nonuniform sampling compression method was tested on a set of 30 images. This set included 5 high resolution NASA images, 5 digital mammograms, 3 fingerprint images, 12 large images mostly taken from personal digital camera and 5 small images. Four different algorithms were compared, two of them state of the art lossless compression software: WinZip, RAR, 7Zip, near lossless nonuniform sampling compression method alone, and nonuniform sampling compression method +7Zip.

Figure 10:
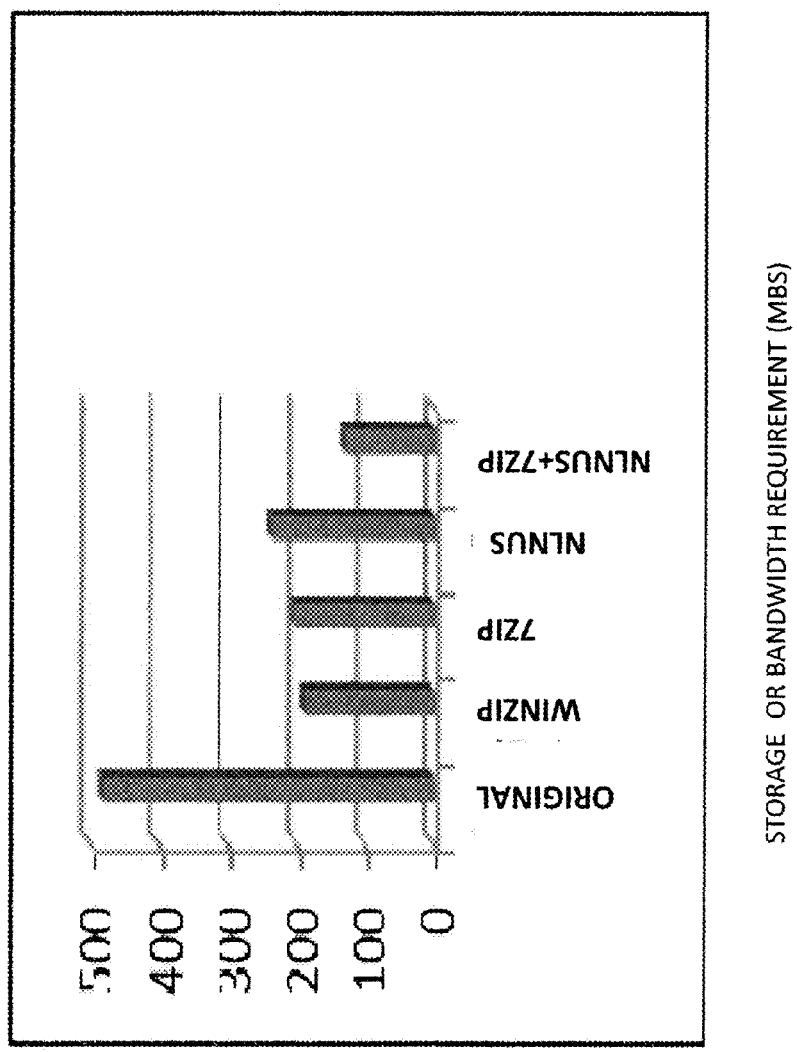
FIG. 10 illustrates a comparison of the storage memory utilized by 30 sample images compressed using WinZip, RAR, 7Zip, near lossless nonuniform sampling compression method alone, and nonuniform sampling compression method +7Zip.
Figure 11:
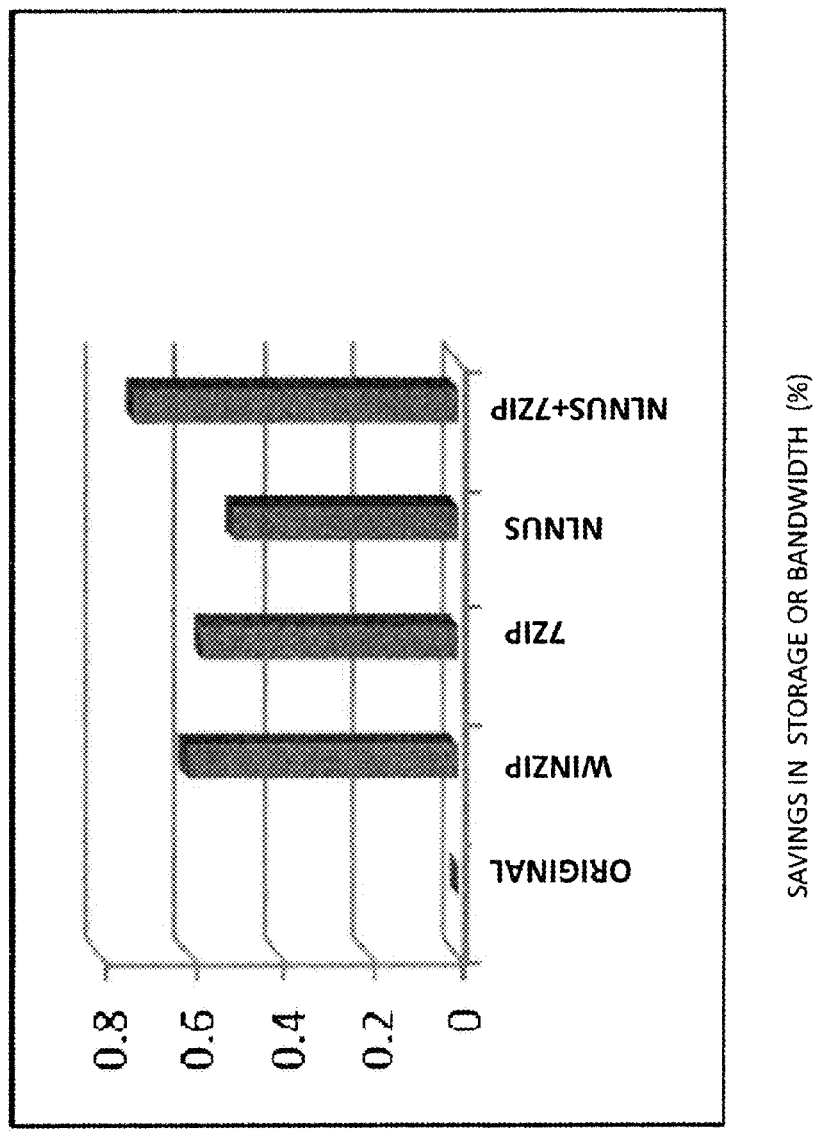
FIG. 11 illustrates a comparison of the storage or bandwidth savings obtained on 30 sample images compressed using WinZip, RAR, 7Zip, near lossless nonuniform sampling compression method alone, and nonuniform sampling compression method +7Zip.
Figure 12:
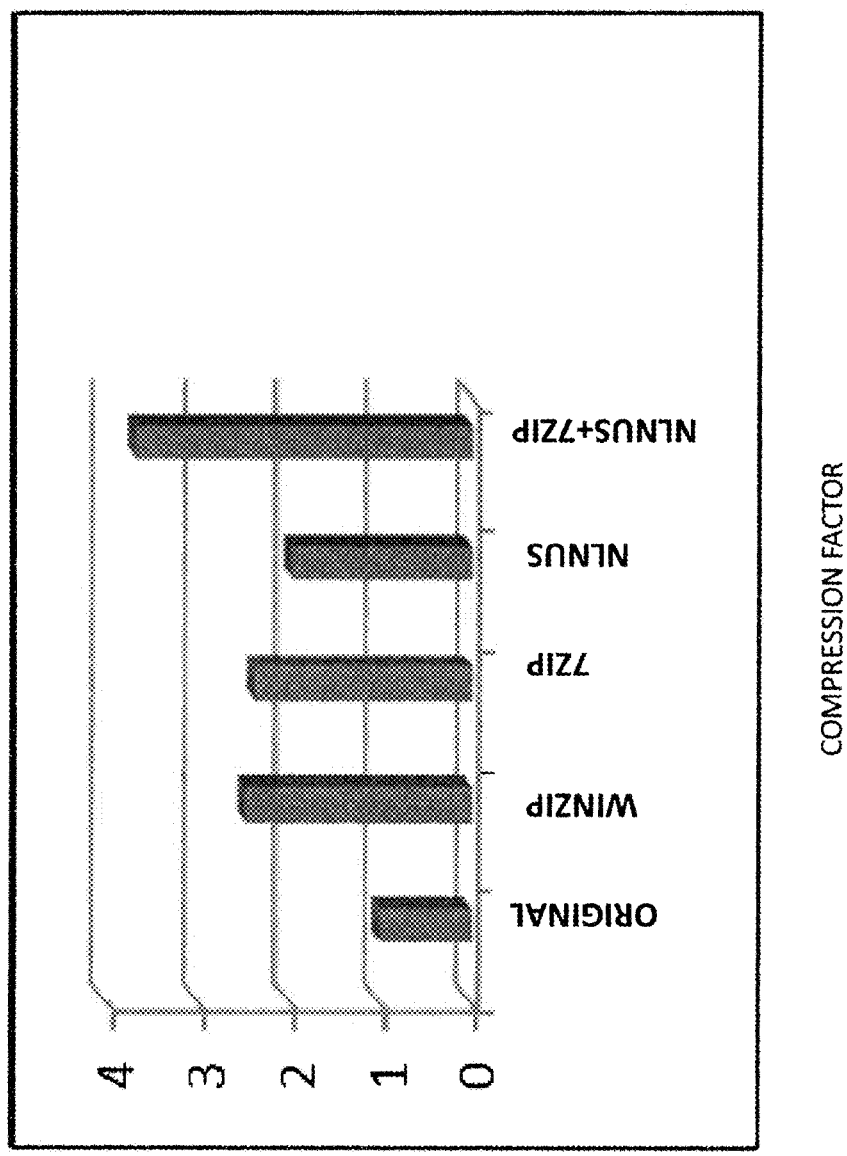
FIG. 12 illustrates a comparison of the compression factor obtained for 30 sample images compressed using WinZip, RAR, 7Zip, near lossless nonuniform sampling compression method alone, and nonuniform sampling compression method +7Zip.

FIGS. 10, 11 and 12 illustrate a comparison of the storage memory, storage or bandwidth savings, and the compression factor for the 30 sample images. Inspection of FIGS. 10, 11 and 12 demonstrates that the near lossless nonuniform sampling compression method (NLNUS) is comparable in performance to the current prior art compression results achieved using WinZip RAR or the 7Zip open source code software. When the near lossless nonuniform sampling compression method was compressed with the 7Zip open source code software, the combination of the near lossless nonuniform sampling compression method with 7 Zip outperformed the other approaches.

In some further test trials, when the near lossless nonuniform sampling compression method alone was tested on a variety of data it was found that some very slight streaking artifacts hardly perceptible to casual observation showed in some images having curved surfaces that were very smooth. The very slight streaking artifacts did not appear on all curved surfaces but only on particular curved surfaces having specific angles.

Embodiments in accordance with the invention and the near lossless nonuniform sampling compression method provide near lossless compression. With linear interpolation the near lossless nonuniform sampling compression method results in an absolute mean error of <0.5% and with cubic interpolation near lossless nonuniform sampling compression method can provide error below the noise level of the image sensor.

In some embodiments, the near lossless nonuniform sampling compression method alone results on the average a 50% reduction in storage and coupled with other lossless compression methods can result in 70% reduction in storage or bandwidth or an equivalent compression factor of 4; an improvement over state of the art lossless compression methods. Embodiments in accordance with the invention can result in even a higher compression or storage and bandwidth savings for video images.

Coupled with lossy compression algorithms, some embodiments can provide improved compression over current prior art compressions methods such as JPEG, JPEG 2000 or MPEG-4 methods of lossy compression. Embodiments in accordance with the invention have applicability in reducing the bandwidth and battery usage of onboard sensor systems. In some embodiments, the near lossless nonuniform sampling compression method can be used as a preprocessor and a linear or cubic interpolator as a post processor to encode, transmit and decode and display signals. In some embodiments, the near lossless nonuniform sampling compression method can be incorporated into graphics and video processing chips for improved real time 3-D high definition applications.

Accordingly, this description provides exemplary embodiments of the present invention. The scope of the present invention is not limited by these exemplary embodiments. Numerous variations, whether explicitly provided for by the specification or implied by the specification or not, may be implemented by one of skill in the art in view of this disclosure.

What is claimed is:

1. A method comprising:
   obtaining an input of an image signal, said image having a plurality of rows of size N;
   for each row of said image:
      nonuniformly sampling said row of said image to generate a plurality of nonuniform samples of said row, each nonuniform sample having an associated sample value and an associated bit representation;
      determining if said row has a constant value P;
      when said row has a constant value P, generating an {RX, RY} value of {0, P}, where P is the constant value;
      when said row does not have a constant value P, applying a 1-D Laplacian transform of S*{−0.1 0.8 −0.1} to each sample value of said row to generate an L value for each said nonuniform sample;
      determining the absolute value of each said L value;
      determining whether each said absolute value of each said L value is greater than a threshold value T;
      determining an L' value for each said absolute value greater than said threshold T, wherein L'=the absolute value greater than said threshold T;
      determining all L' values greater than zero;
      from the L' values greater than zero, selecting the L' value of a first sample of the row, the L' value of a last sample of the row, and all the local maxima and minima of L' of the row;
      generating an {RX, RY} value for each selected L' value, where RX is a bit representation of the sample associated with said L' value and RY is a sample value of the sample associated with said L' value; and
      outputting each said {RX, RY} value for said row.

2. The method of claim 1 further comprising:
   applying a lossless generalized discrete wavelet transform (GDWT) to each said {RX, RY} value to generate a wavelet transform value; and
   outputting said wavelet transform value.

3. The method of claim 2 further comprising:
   applying at least one method selected from the group consisting of a Huffman compression method, a Lev-Zimpel-Welch (LZW) compression method, and a run length coding method to said wavelet transform value to generate a near lossless nonuniformly sampled compressed data value; and
   outputting said near lossless nonuniformly sampled compressed data value.

4. The method of claim 2 wherein said lossless generalized discrete wavelet transform (GDWT) is a lossless 1-2-1 generalized discrete wavelet transform (GDWT).

5. The method of claim 1 further comprising:
   applying a lossy generalized discrete wavelet transform (GDWT) to each output {RX, RY} value to generate a lossy wavelet transform value; and
   outputting said lossy wavelet transform value.

6. The method of claim 5 further comprising:
   applying at least one of the methods consisting of a Huffman compression method, a Lev-Zimpel-Welch (LZW) compression method and a run length coding method to said lossy wavelet transform value to generate a lossy nonuniformly sampled compressed data value; and
   outputting said lossy nonuniformly sampled compressed data value.

7. The method of claim 6 wherein said lossy generalized discrete wavelet transform (GDWT) is a lossy 1-2-1 generalized discrete wavelet transform (GDWT).

8. A device comprising:
   a nonuniform sampling module for nonuniformly sampling each row of a received digitized image and generating one or more {RX,RY} values representing said image row data, wherein said generating one or more {RX,RY} values representing said image row data comprises:
   obtaining an input of a image signal, said image having a plurality of rows of size N;
   for each row of said image:

nonuniformly sampling said row of said image to generate a plurality of nonuniform samples of said row, each nonuniform sample having an associated sample value and an associated bit representation;

determining if said row has a constant value P;

when said row has a constant value P, generating an {RX, RY} value of {0, P}, where P is the constant value;

when said row does not have a constant value P, applying a 1-D Laplacian transform of S*{−0.1 0.8 −0.1} to each sample value of said row to generate an L value for each said nonuniform sample;

determining the absolute value of each said L value;

determining whether each said absolute value of each said L value is greater than a threshold value T;

determining an L' value for each said absolute value greater than said threshold T, wherein L'=the absolute value greater than said threshold T;

determining all L' values greater than zero;

from the L' values greater than zero, selecting the L' value of a first sample of the row, the L' value of a last sample of the row, and all the local maxima and minima of L' of the row;

generating an {RX, RY} value for each selected L' value, where RX is a bit representation of the sample associated with said L' value and RY is a sample value of the sample associated with said L' value; and outputting each said {RX, RY} value for said row;

a generalized discrete wavelet transform (GDWT) module for receiving each said one or more {RX, RY} values and for generating and outputting a wavelet transform value; and a lossless Huffman/LZW/run length coding module for receiving said wavelet transform value and for generating and outputting a nonuniformly sampled compressed data value.

9. The device of claim 8 wherein said generalized discrete wavelet transform (GDWT) module utilizes a lossless GDWT; and further wherein said nonuniformly sampled compressed data value is a near lossless nonuniformly sampled compressed data value.

10. The device of claim 9 wherein said lossless GDWT is a 1-2-1 GDWT.

11. The device of claim 8 wherein said generalized discrete wavelet transform (GDWT) module utilizes a lossy GDWT; and further wherein said nonuniformly sampled compressed data value is a lossy nonuniformly sampled compressed data value.

12. The device of claim 11 wherein said lossy GDWT is a 1-2-1 lossy GDWT.

* * * * *